US005179357A

United States Patent [19]

Perraud

[11] Patent Number: 5,179,357

[45] Date of Patent: Jan. 12, 1993

[54] HIGH G TEMPERATURE COMPENSATED CURRENT SOURCE

[75] Inventor: Jean-Claude Perraud, St. Aubin/Mer, France

[73] Assignee: U.S. Philips Corporation, New York, N.Y.

[21] Appl. No.: 772,894

[22] Filed: Oct. 4, 1991

[30] Foreign Application Priority Data

Oct. 5, 1990 [FR] France ................................ 90 12307

[51] Int. Cl.[5] ................................................ H03F 3/16

[52] U.S. Cl. ..................................... 330/288; 330/289

[58] Field of Search ................ 330/288, 289; 323/315, 323/316; 307/296.6

[56] References Cited

U.S. PATENT DOCUMENTS

| | | | |
|---|---|---|---|
| 4,242,650 | 12/1980 | Cordell | 330/284 |
| 4,350,904 | 9/1982 | Cordell | 330/288 |
| 4,356,454 | 10/1982 | Sueyoshi et al. | 330/288 |
| 4,356,455 | 10/1982 | Ozawa et al. | 330/288 |
| 4,540,896 | 9/1985 | Tanaka | 330/288 |
| 4,990,803 | 2/1991 | Gilbert | 307/296.6 |

*Primary Examiner*—Eugene R. LaRoche
*Assistant Examiner*—Tan Dinh
*Attorney, Agent, or Firm*—Bernard Franzblau

[57] ABSTRACT

A current source which provides a given ratio (G) of an output current (I) to an input current (i). The current source includes a first series combination of a first resistor ($R_1$) connected in series with the main current path of a first transistor ($T_1$) and a second series combination of a second resistor ($R_3$) connected in series with the main current path of a second transistor ($T_2$). The first and second transistors ($T_1$, $T_2$) form a current mirror circuit. A current equalizer is coupled to the current mirror circuit in such a way as to produce in the first series combination an equalizing voltage drop equal to $$V_T \operatorname{Log} \frac{I}{i} \cdot \frac{i_{s1}}{i_{s2}}$$

$i_{s1}$ and $i_{s2}$ denoting the characteristic current constants of the first and second transistors ($T_1$, $T_2$).

21 Claims, 2 Drawing Sheets

HIGH G TEMPERATURE COMPENSATED CURRENT SOURCE

FIELD OF THE INVENTION

The present invention relates to a current source which has a given ratio of an output current I to an input current i and comprises a first series combination which includes a first resistor connected in series with the main current path of a first transistor, so as to be passed through by the input current, and a second series combination which includes a second resistor connected in series with the main current path of a second transistor for producing the output current, the first and second transistors being arranged so as to form a first current mirror circuit.

BACKGROUND OF THE INVENTION

Current sources of this type are generally used having small ratios G (up to about 10) of output current to input current. For these uses the second transistor has an emitter surface G times greater than that of the first transistor (or it is constituted by G individual transistors which are identical to the first transistor and arranged in parallel) so as to obtain the same base/emitter voltage drop in the first and second transistors, and avoid variations of the ratio G as a function of temperature.

For higher ratios G, for example, ranging to 100, such a solution leads to prohibitive dimensions for the second transistor, and in that case arrangements with an operational amplifier will be used. Such solutions are used, for example, by MATRA COMMUNICATION (French patent application 88 01645, dated Feb. 11, 1988, more particularly, FIG. 5), SGS-THOMSON (report of the TEA 7063 circuit—Telephone Speech and Peripherals Line Control) and MOTOROLA (Product preview of the TCA 3385 circuit—Telephone Ring Signal Converter).

These embodiments have the disadvantage of requiring the presence of an operational amplifier which takes up a relatively large space in the integrated circuit, and which, furthermore, may present problems of stability, especially if the circuit forms part of a complex arrangement presenting cascaded stages.

SUMMARY OF THE INVENTION

The present invention has for an object to provide a current source which, more specifically but not exclusively, makes it possible to obtain high ratios G of an output current to an input current, without an appreciable thermal drift of the ratio G, while using a much simpler circuit than an operational amplifier and not further posing any stability problem.

A current source according to the invention is thus characterized in that it comprises an equalizing circuit arranged in a manner such that it permits, at least in a section of the first series combination, an equalizing current ($i_0$) to flow as a linear function of temperature, so as to produce a voltage drop in the first series combination. The equalization is substantially proportional to a proportionality factor equal to the thermal voltage ($V_T$) multiplied by the logarithm of the product of the ratio of the output current I to the input current i and the ratio of the characteristic current constant of the first transistor (T1) to the characteristic current constant of the second transistor ($T_2$).

The equalizing circuit, which can simply be realised with current sources, makes it possible to equalize the difference between the emitter/base voltages of the two transistors which therefore need no longer have different dimensions, and also makes it possible to avoid the complication and the additional crystal surface of the integrated circuit due to the use of an operational amplifier, and thus leads to a reduction of cost.

The equalizing circuit may comprise a third series combination which includes the main current paths of a diode-arranged third transistor and a fourth transistor, as well as a fourth series combination which includes the main current path of a fifth transistor whose base is connected to that of the third transistor, and a third resistor. According to a first embodiment of the invention, which permits of obtaining approximate equalization, the fourth transistor is arranged as a diode. According to a second preferred embodiment of the invention, which provides more accurate equalization, the fourth series combination comprises, between the main current path of the fifth transistor and the third resistor, the main current path of a sixth transistor whose base is connected to the collector of the fourth transistor, whose collector is connected to the base of the fourth transistor and whose emitter has a surface which is larger than that of the emitter of the fourth transistor.

The third series combination may be arranged in a way such that a current substantially equal to the input current flows through this combination. This makes it possible to feed the equalizing circuit without the need for an additional current source. Since it is easy to choose an equalizing current of a smaller value than the input current, a supply of the equalizing circuit based on a current equal to the input current is always sufficient.

The first series combination may comprise a fourth resistor in a series combination with the first resistor, the current equalizer then having an input connected to a junction common to the first and fourth resistors. This permits of having an additional parameter for determining the equalization.

The current source may comprise an input branch which has an input resistor and forms a second current mirror circuit with the first series combination. In this fashion a buffer interface can be realised having a fixed or programmable input impedance thereby blocking the interference from the output to the input of the interface.

The invention also relates to a power amplifier in which the input resistor is constituted by a divider bridge whose central point constitutes the input of the amplifier.

BRIEF DESCRIPTION OF THE DRAWINGS

The invention will be better understood by reading the following description, given by way of non-limiting example, with reference to the appended drawings, in which.

DESCRIPTION OF THE PREFERRED EMBODIMENTS

Figure 1:
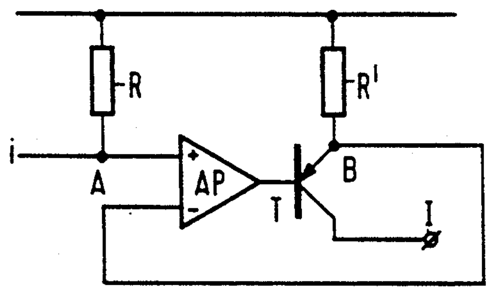
FIG. 1 shows a current source having a high ratio of the output current to the input current and using an operational amplifier.

As shown in FIG. 1, an operational amplifier AP includes a resistor R at its non-inverting input and a resistor R' at its output B (the emitter of a transistor T arranged as an emitter follower). The resistor R' is connected to the inverting input of the amplifier AP. An input current i is injected into the input A and passes through the resistor R. The amplifier AP maintains the voltages at A and B, equal so one has:

$$G=I/I=R/R'$$

The ratio G is defined with good accuracy, but on the other hand, an operational amplifier requires many components and poses problems of stability and frequency response.

Figure 2:
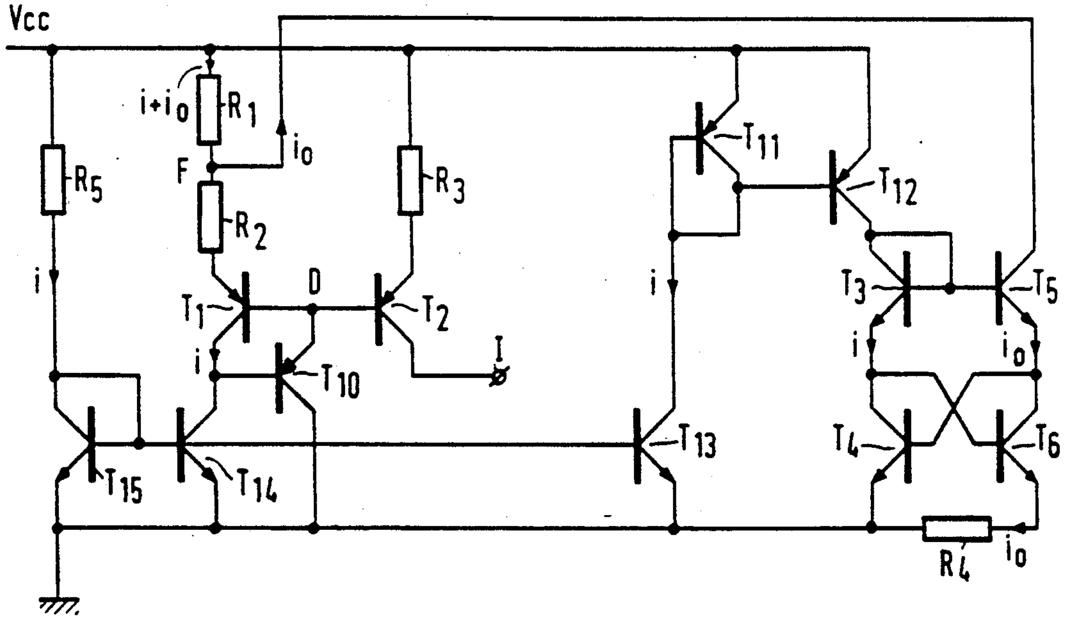
FIG. 2 shows a current source according to a preferred embodiment of the invention.

As shown in FIG. 2, a transistor $T_1$ of the pnp type has its emitter connected to a supply voltage source Vcc through two resistors connected in a series circuit $R_1$ and R2, and its base (point D) to the base of a transistor $T_2$ of the pnp type whose emitter is connected to the voltage source Vcc through a resistor $R_3$ and whose collector supplies an output current I. A pnp transistor $T_{10}$ has its base connected to the collector of the transistor $T_1$, its emitter to the base of the transistors $T_1$ and $T_2$ and its collector to the common mode pole (ground). The transistors $T_1$ and $T_2$ form a current mirror circuit having the ratio G of current I to i, but with a considerable thermal dependence if the two transistors do not have ratios corresponding to the ratio G, that is to say, if the emitter of the transistor $T_2$ does not have an effective surface equal to G times that of the emitter of the transistor $T_1$. Needless to observe that different types of prior art current mirror circuits could be used.

An input current mirror circuit comprises, in a series combination between the voltage source Vcc and the common mode pole, a resistor $R_5$ and the main current path of an npn transistor $T_{15}$ arranged as a diode via a short-circuited base/collector. The base of the transistor $T_{15}$ is connected to the base of an npn transistor $T_{14}$ whose main current path is connected between the collector of transistor $T_1$ and ground. For the identical transistors $T_{14}$ and $T_{15}$ the same input current i passes through their main current paths. The current i is dependent upon $V_{cc}$, on $R_5$ and also the characteristics of the transistor $T_{15}$.

The basic idea of the invention is to pass through the input branch an equalizing current $i_0$ which is suitable for correcting the thermal dependence of the ratio G. It thus will no longer be necessary to use transistors $T_1$ and $T_2$ of different dimensions. For the calculation the following configuration has been selected:

the current $i_0$ passes through the resistor $R_1$, the transistors $T_1$ and $T_2$ have $i_{s1}$ and $i_{s2}$ as their respective characteristic current constants, that is to say, $i_{s1}=i_{s2}$ if $T_1$ and $T_2$ are nominally identical.

Because the transistors $T_1$ and $T_2$ have their main current paths passed by the currents i and I respectively, their respective base/emitter voltages $V_{BET1}$ and $V_{BET2}$ have for their values:

$$V_{BET1}=V_T \operatorname{Log}(i/i_{s1})$$

$$V_{BET2}=V_T \operatorname{Log}(I/i_{s2})$$

where $$V_T=(kT)/q$$

k=Boltzmann constant q=electron charge

T=absolute temperature

By writing the equality of the voltages at point D, we then have:

$$R_1(i+i_0)+R_2i+V_T\operatorname{Log}\frac{i}{i_{s1}}=R_3I+V_T\operatorname{Log}\frac{I}{i_{s2}}$$

or $$(R_1+R_2)i-R_3I=V_T\operatorname{Log}\frac{I}{i}\,\frac{i_{s1}}{i_{s2}}-R_1i_0$$

There will be equalization for:

$$R_1i_0=V_T\operatorname{Log}\frac{I}{i}\,\frac{i_{s1}}{i_{s2}}$$

and thus $$G=\frac{I}{i}=\frac{R_1+R_2}{R_3} \qquad (1)$$

In order to realise the equalization, the junction F of the resistors $R_1$ and $R_2$ is connected to the collector of an npn transistor $T_5$ whose main current path is connected in series with that of a transistor $T_6$ of the same type and a resistor $R_4$ of which one terminal is connected to ground. The base of the transistor $T_5$ is connected to that of an npn transistor $T_3$ arranged as a diode and whose main current path is connected in series with that of a transistor $T_4$ whose emitter is connected to ground. The base of the transistor $T_4$ is connected to the collector of the transistor $T_6$ and the collector of the transistor $T_4$ is connected to the base of the transistor $T_6$. The series combination constituted by the transistors $T_3$ and $T_4$ is fed by an arbitrary intensity current source here selected to be equal to the input current i to simplify the circuit. Actually, it will be sufficient to have one transistor $T_{13}$ of the npn type whose base is connected to that of the transistor $T_{14}$ (and of the transistor $T_{15}$), whose emitter is connected to ground and whose collector is connected to that of a pnp transistor $T_{11}$ whose emitter is connected to the voltage source Vcc and which is arranged as a diode over a base-collector node. By connecting the base-collector node of the transistor $T_{11}$ to the base of a pnp transistor $T_{12}$ whose main current path is connected in series with that of the transistor $T_3$, and whose emitter is connected to the voltage source Vcc, a current mirror circuit is obtained which causes a current i to flow through the series combination $T_3$, $T_4$.

The current $i_o$ has for its value:

$$R_4i_0=V_T\operatorname{Log}(i_{s6}/i_{s4})$$

where $i_{s4}$ and $i_{s6}$ are the characteristic current constants of the respective transistors $T_4$ and $T_6$. The ratio $i_{s6}/i_{s4}$ is equal to the ratio of the effective surface surfaces of the respective emitters of $T_6$ to that of $T_4$.

$$\frac{R_1}{R_4} = \frac{\text{Log}\,\frac{I}{i}\,\frac{i_{s1}}{i_{s2}}}{\text{Log}\,\frac{i_{s6}}{i_{s4}}} \tag{2}$$

In a digital application:

$$G = 100 \qquad i_{s1} = i_{s2} \qquad i_{s6} = 2i_{s4}$$

$$R_1 + R_2 = 100\,R_3 \qquad R_1 = 6.64\,R_4$$

It should be observed for that matter that the above arrangement has the advantage of being capable of operating with low values of $V_{cc}$ (at least equal to 3 $V_{be}$; $V_{be}$ designating the base-emitter voltage of a transistor, that is about 0.8 V).

Figure 3:
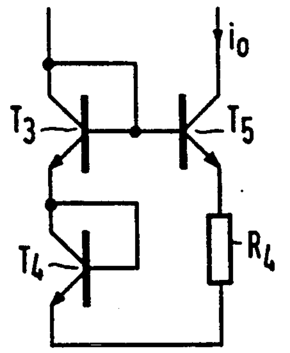
FIG. 3 shows a simplified variant of the equalizing circuit shown in FIG. 2.

As shown in FIG. 3, equalization by the current $i_0$ is obtained by means of a circuit which is simpler than the above circuit in that the transistor $T_6$ is omitted and in that the transistor $T_4$ is arranged as a diode. The equalization is only approximated and one condition is that $i_0$ should be very near to i.

One thus has:

$$i_0 = \frac{V_T}{R_4}\,\text{Log}\,\frac{i}{i_{s4}}$$

Figure 4:
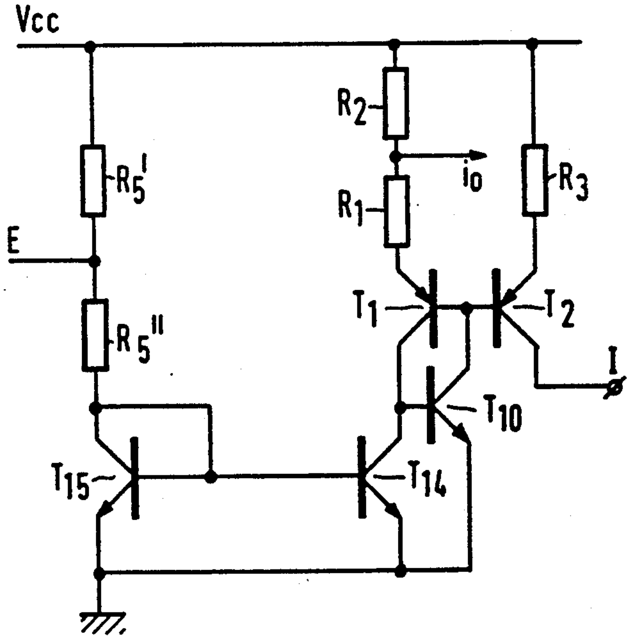
FIG. 4 shows a power amplifier comprising a current source according to the invention.

FIG. 4 shows a power amplifier utilizing a current source as defined above. The resistor $R_5$ is replaced by two series-connected resistors $R'_5$ and $R''_5$ whose central point constitutes the input E of the amplifier. One thus obtains a voltage gain equal to $R_1+R_2/R''_5$, and a current gain equal to G. Example:

$$R'_5 = 1\,\text{M}\Omega \qquad R''_5 = 1\,\text{k}\Omega$$

$$R_1 + R_2 = 100\,\text{k}\Omega \qquad R_3 = 1\,\text{k}\Omega$$

It should be observed that in the preceding description the current $i_0$ was introduced at the node F between the resistors $R_1$ and $R_2$ of the input branch. Because the equalization is realised by introducing an additional voltage drop in the input branch, this drop can take place at any point in the input branch. More particularly, only a single resistor $R_1$ ($R_2=0$) could be used for this purpose. The presence of the resistor $R_2$ permits facilitating the choice of the values.

I claim:

1. A current source which has a given ratio of an output current I to an input current i and comprises, a first series combination which includes a first resistor connected in series with a main current path of a first transistor so as to pass the input current, and a second series combination which includes a second resistor connected in series with a main current path of a second transistor for producing the output current, the first and second transistors being connected so as to form a first current mirror circuit, an equalizing circuit which permits, at least in a section of the first series combination, an equalizing current ($i_O$) to flow as a linear function of temperature so as to produce a voltage drop in the first series combination, which equalization is substantially proportional to a thermal voltage ($V_T$) proportionality factor multiplied by the logarithm of the product of the ratio of the output current I to the input current i and the ratio of the characteristic current constant of the first transistor to the characteristic current constant of the second trasnsistor.

2. A current source as claimed in claim 1, wherein the equalizing circuit means comprises a third series combination which includes the main current paths of a third transistor connected arranged as a diode and a fourth transistor as well as a fourth series combination which includes a third resistor and a main current path of a fifth transistor whose base is connected to the base of the third transistor.

3. A current source as claimed in claim 2, wherein the fourth transistor is connected as a diode.

4. A current source as claimed in claim 2, wherein the fourth series combination further comprises, between the main current path of the fifth transistor and the third resistor, the main current path of a sixth transistor whose base is connected to a collector of the fourth transistor, whose collector is connected to a base of the fourth transistor, and whose emitter has a surface area which is larger than that of the emitter of the fourth transistor.

5. A current source as claimed in claim 4 wherein the third series combination is connected so as to pass a current which is substantially equal to the input current (i).

6. A current source as claimed in claim 2 wherein the first series combination further comprises a fourth resistor connected in series with the first resistor and in that the equalizing circuit means has an input connected to a node common to the first and fourth resistors.

7. A current source as claimed in claim 2 which further comprises an input branch which includes an input resistor and which input branch forms a second current mirror circuit with the first series combination.

8. A current source as claimed in claim 7 wherein the input resistor comprises a divider bridge having a tap point which is coupled to a signal input (E) whereby the current source operates as a power amplifier.

9. A current source as claimed in claim 2 wherein the third series combination is connected so as to pass a current which is substantially equal to the input current (i).

10. A current source as claimed in claim 3 wherein the third series combination is connected so as to pass a current which is substantially equal to the input current (i).

11. A current source as claimed in claim 10 wherein the first series combination further comprises a fourth resistor connected in series with the first resistor and in that the equalizing circuit means has an input connected to a node common to the first and fourth resistors.

12. A current source as claimed in claim 4 wherein the first series combination further comprises a fourth resistor connected in series with the first resistor and in that the equalizing circuit means has an input connected to a node common to the first and fourth resistors.

13. A current source as claimed in claim 1 which further comprises an input branch which includes an input resistor and which input branch forms a second current mirror circuit with the first series combination.

14. A current source as claimed in claim 9 which further comprises an input branch which includes an input resistor and which input branch forms a second current mirror circuit with the first series combination.

15. A current source as claimed in claim 1 wherein the first series combination further comprises a third resistor connected in series with the first resistor and wherein the equalizing circuit means comprises an input connected to a node common to the first and third resistors.

16. A current source as claimed in claim 1 which further comprises an input branch which includes an input resistor and a diode-connected transistor coupled to the first series combination so as to form therewith a second current mirror circuit.

17. A current source having a high ratio (G) of output current (I) to input current (i) comprising:

first and second supply voltage terminals, a first series combination of a first resistor and a first transistor coupled to said supply voltage terminals and through which flows a current equal to the input current (i), a second series combination of a second resistor and a second transistor coupled to one of said supply voltage terminals and to an output terminal for supplying said output current (I), means connecting said first and second transistors to form a current mirror circuit, and a current equalizer circuit coupled to a branch of the current mirror circuit so as to produce in a section of the first series combination an equalizing current ($i_o$) which is a linear function of temperature thereby to derive in said first series combination an equalizing voltage equal to $V_T$ LOG I/i ($i_{s1}/i_{s2}$) where $V_T$ is a thermal voltage proportionality factor and $i_{s1}$ and $i_{s2}$ are the characteristic current constants of the first and second transistors, respectively.

18. A current source as claimed in claim 17 wherein the dimensions of the first and second transistors are the same, said current source further comprising an input branch including a third series combination of a third resistor and a third transistor coupled to said voltage supply terminals and with the third transistor coupled to said first transistor to form therewith a second current mirror circuit which produces said input current (i) in the first series combination.

19. A current source as claimed in claim 17 wherein said current equalizer circuit comprises:

a third series combination of a diode-connected third transistor and a fourth transistor coupled to said supply voltage terminals, and a fourth series combination of a third resistor and a fifth transistor coupled to said supply voltage terminals and with the base of the fifth transistor connected to the base of the third transistor.

20. A current source as claimed in claim 19 further comprising:

a fifth series combination of a diode-connected sixth transistor and a seventh transistor coupled to said supply voltage terminals and with the sixth and seventh transistors coupled to the third series combination and the first series combination, respectively, to form therewith second and third current mirror circuits, respectively.

21. A current source as claimed in claim 20 wherein;

the first series combination further comprises a fourth resistor connected in series with the first resistor and having a junction point therebetween coupled to said fourth series combination.

* * * * *

UNITED STATES PATENT AND TRADEMARK OFFICE
CERTIFICATE OF CORRECTION

PATENT NO. : 5,179,357
DATED : January 12, 1993
INVENTOR(S) : Jean-Claude Perraud It is certified that error appears in the above-indentified patent and that said Letters Patent is hereby corrected as shown below:

Column 3, line 11, delete "," (comma);
line 44, delete "the";
Column 4, line 67, delete "surface";
line 68, change "emitters" to --emitter--.

IN THE CLAIMS

Claim 1, column 5, line 60, after "circuit" (second occurrence) insert --means--.

Claim 2, column 6, line 6, delete "arranged".

Signed and Sealed this

First Day of March, 1994

Attest:

BRUCE LEHMAN

*Attesting Officer*

*Commissioner of Patents and Trademarks*